US010627093B2

(12) United States Patent
Duong et al.

(10) Patent No.: US 10,627,093 B2
(45) Date of Patent: Apr. 21, 2020

(54) SYSTEMS AND METHODS FOR A HEAT SINK

(71) Applicant: Fluence Bioengineering, Austin, TX (US)

(72) Inventors: Dung Duong, Austin, TX (US); Randall Johnson, Austin, TX (US); Nicholas Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

(21) Appl. No.: 15/651,941

(22) Filed: Jul. 17, 2017

(65) Prior Publication Data

US 2018/0324980 A1 Nov. 8, 2018

Related U.S. Application Data

(60) Provisional application No. 62/500,945, filed on May 3, 2017.

(51) Int. Cl.
*F21V 29/502* (2015.01)
*F21V 29/76* (2015.01)
(Continued)

(52) U.S. Cl.
CPC .............. *F21V 29/502* (2015.01); *A01G 9/20* (2013.01); *F21V 23/009* (2013.01); *F21V 29/745* (2015.01); *F21V 29/75* (2015.01); *F21V 29/76* (2015.01); *F21V 29/763* (2015.01); *F21V 29/83* (2015.01); *F28F 3/02* (2013.01); *H01L 23/367* (2013.01); *H05K 1/021* (2013.01); *H05K 7/20409* (2013.01); *A01G 9/26* (2013.01);
(Continued)

(58) Field of Classification Search
CPC .... H05K 7/20409; H05K 1/05; H05K 3/0061; F21V 29/502; F21V 29/745; F21V 29/75; F21V 29/76; F21V 29/763; F21V 29/83; F21V 29/74; F21V 23/009; F21V 19/0055; H01L 23/367; F28F 3/02; F28F 3/025; A01G 9/26; F21W 2131/40; F28D 2021/0029
USPC ........................................................ 165/80.3
See application file for complete search history.

(56) References Cited

U.S. PATENT DOCUMENTS 4,369,838 A * 1/1983 Asanuma ............ H01L 23/4006
165/185
6,189,601 B1 * 2/2001 Goodman ........... F28D 15/0233
165/104.33

(Continued)

OTHER PUBLICATIONS

Kim, Harry C., International Search Report and Written Opinion of the International Searching Authority, for counterpart application PCT/US2018/029852, dated Jun. 11, 2018, U.S. Patent and Trademark Office, Alexandria, Virginia, U.S., 4 pages.

*Primary Examiner* — Gordon A Jones
(74) *Attorney, Agent, or Firm* — Yutian Ling

(57) ABSTRACT

Embodiments may utilize a series of exposed fins, which increase the surface area of the heat sink creating additional air flow. As hotter air rises within the system, cooler is drawn into the heatsink. The fins may be exposed on both sides of the longitudinal axis, allowing cooler air to be drawn towards the longitudinal axis above the heatsink and flow upward. This process may cool the fins. Additionally, the spacing between the fins may have to be wide enough to allow for air to freely enter the heatsink.

7 Claims, 3 Drawing Sheets

(51) Int. Cl.

| | |
|---|---|
| *F21V 29/74* | (2015.01) |
| *F21V 29/75* | (2015.01) |
| *F21V 23/00* | (2015.01) |
| *H05K 7/20* | (2006.01) |
| *F28F 3/02* | (2006.01) |
| *H01L 23/367* | (2006.01) |
| *H05K 1/02* | (2006.01) |
| *F21V 29/83* | (2015.01) |
| *A01G 9/20* | (2006.01) |
| *H05K 1/05* | (2006.01) |
| *H05K 3/00* | (2006.01) |
| *A01G 9/26* | (2006.01) |
| *F28D 21/00* | (2006.01) |
| *F21W 131/40* | (2006.01) |
| *F21Y 103/10* | (2016.01) |
| *F21V 29/67* | (2015.01) |
| *F21Y 115/10* | (2016.01) |
| *F21V 19/00* | (2006.01) |

(52) U.S. Cl.
CPC .......... *F21V 19/0055* (2013.01); *F21V 29/67* (2015.01); *F21W 2131/40* (2013.01); *F21Y 2103/10* (2016.08); *F21Y 2115/10* (2016.08); *F28D 2021/0029* (2013.01); *F28F 3/025* (2013.01); *H05K 1/05* (2013.01); *H05K 3/0061* (2013.01)

(56) References Cited

U.S. PATENT DOCUMENTS

| | | | |
|---|---|---|---|
| 8,707,551 B2* | 4/2014 | Amey | H05K 1/056 |
| | | | 174/250 |
| 8,814,389 B2* | 8/2014 | Horvath | F21K 9/00 |
| | | | 118/620 |
| 9,383,089 B2* | 7/2016 | Yang | F28F 3/02 |
| 2007/0169919 A1* | 7/2007 | Deng | H01L 23/427 |
| | | | 165/104.33 |
| 2008/0295993 A1* | 12/2008 | Chen | H01L 23/427 |
| | | | 165/80.3 |
| 2009/0244852 A1* | 10/2009 | Okada | H01L 23/433 |
| | | | 361/721 |
| 2011/0103060 A1* | 5/2011 | Wang | F21V 29/004 |
| | | | 362/249.02 |
| 2014/0034279 A1* | 2/2014 | Lin | F28F 7/00 |
| | | | 165/185 |
| 2014/0318153 A1 | 10/2014 | Illercil | |
| 2016/0081225 A1* | 3/2016 | Taketomi | F28F 3/02 |
| | | | 165/80.3 |

\* cited by examiner

SYSTEMS AND METHODS FOR A HEAT SINK

CROSS-REFERENCE TO RELATED APPLICATIONS

This application claims a benefit of priority under 35 U.S.C. § 119 to Provisional Application No. 62/500,945 filed on May 3, 2017, which is fully incorporated herein by reference in their entirety.

BACKGROUND INFORMATION

Field of the Disclosure

Examples of the present disclosure are related to systems and methods for a heat sink. More particularly, embodiments disclose a heat sink configured to dissipate heat caused by a light fixture, wherein the heat sink includes exposed fins that allow for additional air flow.

Background

Greenhouses are buildings or complexes in which plants are grown. For various reasons including price, it is typically ideal for greenhouses to operate with as much natural sunlight as possible. To supplement natural light from the sun, high powered lights are used within greenhouses when the sun or other natural light does not provide enough light for optimal plant growth.

However, the operation of the high powered lights is more costly than utilizing free sunlight. More so, conventional high powered lights are larger in size, which blocks the incoming free sunlight. Furthermore, the blocking of the incoming sunlight causes shading on the plants within the greenhouse, which negatively impacts the grower's productivity.

Although light emitting diodes (LEDs) are more efficient than traditional high powered lights, their manufacturing costs are higher. Additionally, the LEDs cause excessive shading based on requiring larger fixtures to dissipate heat. To circumvent the large fixtures required to dissipate the heat, some manufacturers have attempted to build smaller LED fixtures that use active cooling fans. However, in greenhouse environments, active cooling fans quickly clog with dirt, bugs, etc. This causes the LED fixtures with active cooling fans to quickly become inoperable.

Conventional LED fixtures that do not include active cooling fans use traditional linear heat sinks. However, traditional linear heat sinks include wings that extend in a direction parallel with a central axis of the conventional LED fixtures. Heat generated through conventional LED fixtures may dissipate based on convection, conduction or radiation. However, due to LED fixtures being suspended, there is minimal heat dissipation via conduction. Radiation is a function of the fixture temperature and may be significant, and convection is the primary method to dissipate heat. In applications, air particles remove heat from the fixture through air movement. For longer heat sinks, air movement within the middle of the fixtures is minimal. This severely limits the amount of power conventional LED fixtures can consume because additional power consumption leads to more heat.

Accordingly, needs exist for more effective and efficient systems and methods for heat sinks with exposed fins allowing for additional air flow.

SUMMARY

Embodiments disclosed herein describe systems and methods for heat sinks within light fixtures. In embodiments, a heat sink may be a passive system that continually and passively creates a cross-flow thermal management system dissipating large amounts of heat in a slim light fixture.

Embodiments may utilize a series of exposed fins that increase the surface area of the heat sink creating additional air flow. As hotter air rises within the system, cooler is drawn into the heatsink. The fins may have exposed sides, lower surface, and upper surface, allowing cooler air to be drawn towards the longitudinal axis above the light source and flow upward. This process may cool the fins. Additionally, the spacing between the fins may be wide enough to allow for air to freely enter the heatsink.

Embodiments may include systems having top extrusions to create the plurality of fins from an aluminum block. By creating the plurality of fins via extrusions and directly coupling the base or metal core printed circuit board (MCPCB) to the fins, no secondary operations may be required to create the heat sink.

Embodiments may include extruded aluminum to create the plurality of fins, wherein a rib is formed along the longitudinal axis of the heat sink. The extrusions and/or rib may be textured and/or contoured in the heat flow direction. This may increase the surface area of the fins and rib exposed in the heat flow direction, allowing for a more efficient system.

The rib may extend vertically through the center of the plurality of fins. The vertical rib may be configured to pull heat away from a base and/or lower portions of the fins. Additionally, the base may not cover the entirety of a lower surface of the extruded fins. This may allow for more surface area of the fins to be exposed to manage heat flow. The base may include angled overhang that project away from the longitudinal axis of the base at a downward angle, further exposing the lower surfaces of the fins.

Embodiments may include MCPCB base that is directly attached to extruded fins with a rib extending along the central axis of the heat sink. This may allow for lower thermal resistance from heat sources to the fins, while also having less interfaces and/or coupling points. This may lead to a lower probability of air bubbles.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
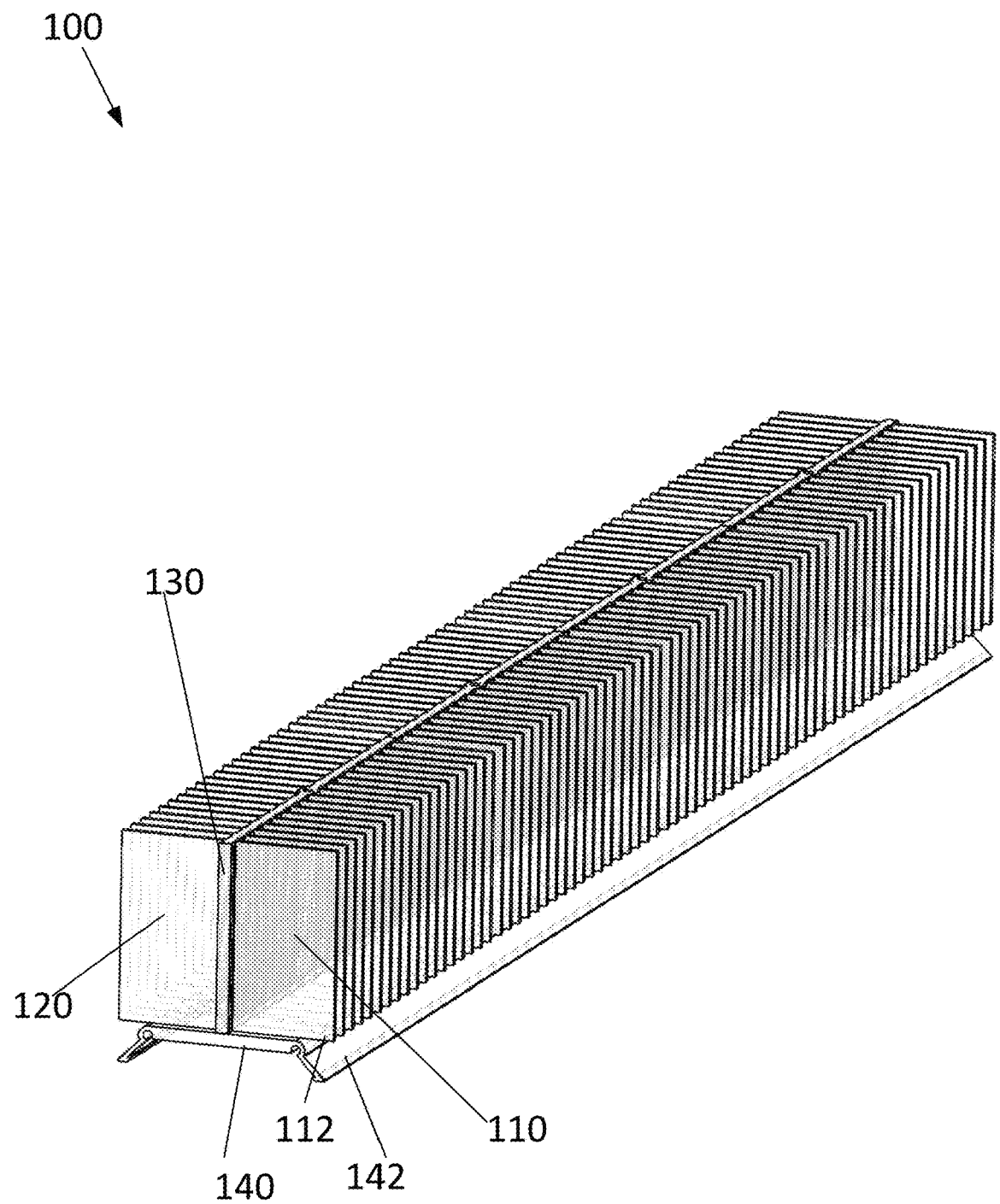
FIG. 1 depicts a cross flow heat sink, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Embodiments may utilize a series of exposed fins that increase the surface area of the heat sink creating additional air flow. The fins may be exposed on both sides of the longitudinal axis of the heat sink, allowing cooler air to be drawn internally towards the longitudinal axis of the heatsink, above the heat source, and flow upward. This process may cool the fins. Additionally, the spacing between the fins may be wide enough to allow for air to freely enter the heatsink via the sides of the fins and/or through exposed lower surfaces of the fins.

FIG. 1 depicts a cross flow heat sink 100, according to an embodiment. Cross flow heat sink 100 may be configured to dissipate heat from a heat source, such as a light fixture, wherein the light fixture may be positioned under heat sink 100. In a conventional linear heat sink, the heat generated from the heat source flows around the heat sink. In cross flow heat sink 100, the generated heat may be configured to flow through spaces between fins 110, 120. This may more rapidly and efficiently dissipate the generated heat. Heat sink 100 may include fins 110, 120, rib 130, and base 140.

Fins 110, 120 may be extrusions from a unitary block of metal, such as aluminum. Fins 110 may be positioned on a first side of rib 130, and fins 120 may be positioned on a second side of rib 130. Fins 110 may be created by extruding the unitary block of metal from an upper surface to the lower surface of the unitary block of metal. Fins 110, 120 may be created by extrusions across the entire height of the unitary block of metal, but only a partial width of the unitary block of metal. This may cause fins 110, 120 to have three exposed edges, and a fourth edge covered by rib 130.

Rib 130 may be a projection, sidewall, surface, extending from a lower surface of heat sink 100 to an upper surface of heat sink 100. Rib 130 may be created by not extruding the unitary block of metal across the entire width of the unitary block of metal. In embodiments, by not extruding the unitary block of metal along its central axis, rib 130 may be formed without an additional procedure. Rib 330 may be the result of extrusions not extending across the central axis of the unitary sheet of metal. To this end, rib 130 may be positioned along the central axis of heat sink 100, wherein a first set of fins 110 may be positioned on a first side of rib 130 and a second set of fins 120 may be positioned on a second side of rib 130. In embodiments, an upper surface of rib 130 may be flush and planar with upper surfaces of fins 110, 120, and a lower surface of rib 130 may be flush and planar with lower surfaces of fins 310, 320.

Rib 130 may be textured, contoured, etc. with channels, grooves, etc. this may assist in increasing the internal surface area of heat sink 100. By increasing the internal surface area of heat sink 100, more efficient air flow through heat sink 100 may be created. In embodiments, the textures, contours, etc. on rib 130 may be symmetrical or asymmetrical across or along the central axis.

Base 140 may be positioned on a lower surface of fins 110, 120 and rib 30. Base 140 may be bonded to the lower surface of finds 310 via adhesives, welding, or any other coupling mechanisms. Base 140 may have a shorter width than that of fins 110, and 120. Thus, base 140 may not extend across the entire width of a lower surface of heat sink 100 By not extending across the entire lower surface of heat sink 100 the outer lower surfaces 112 of fins 110, 120 may be exposed and uncovered, while the internal lower surfaces of fins 110, 120 and a lower surface of rib 130 may be covered by base 140. This may allow hotter air to enter heat sink 100 without traveling to the outer most edge of fins 110, 120. Base 140 may be configured to form a continuous, planar, and covered surface along the lower surfaces of fins 110, 120 and rib 130. In embodiments, base 140 may be configured to couple multiple unitary blocks of metal together along the longitudinal axis of the heat sink 100. This may allow for a longer heat sink 100, which is coupled together along base 140

Protrusions 142 may be positioned at the outer edges of base 140. Protrusions 142 may be projections extending away from base 140. In embodiments, protrusions 142 may project at a downward angle, and may be configured to guide heated air into the heat sink 100 via the lower, exposed areas 112 of fins 110, 110.

Figure 2:
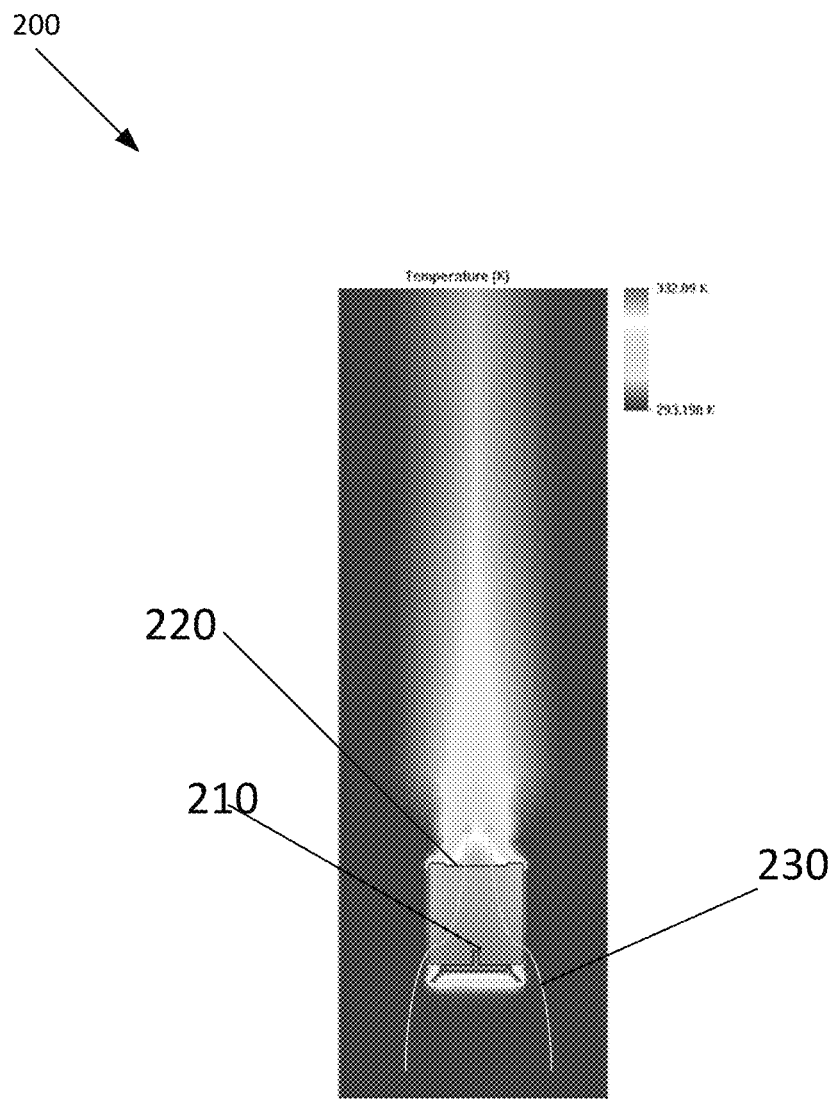
FIG. 2 depicts heat flow from the heat source through the fins, according to an embodiment.

As depicted in FIG. 2 it is desired to increase the heat flow from the heat source through the fins. By increasing the surface area of the heat sink 200 via the fins, as hotter air 230 rises cooler air is draw into the heatsink 200. The cooler air may cool the fins.

As depicted by air flow lines 230 in FIG. 2, heat generated by a heat source below the heat sink 200 may travel around an overhang and towards a central axis of the heat sink 200. The hotter air positioned proximate to the central axis may rise due to cooler air entering the hat sink via the fins. Due to the fins created by the extrusions, the hotter air may be able to travel laterally and vertically through the heat sink.

Furthermore, the heat sink may include a rib 210. Rib 210 may extend across the central axis of the heat sink. However, rib 210 may not extend across the entire height of the fins. Rib 210 may be formed by not extruding across the entire height of a unitary block of metal along the central axis of heat sink 200. Rib 210 may be formed by the un-extruded block of metal, wherein two fins are formed on both sides of rib 210 by fully extruding the entire height of unitary block of metal on both sides of rib 210.

Additionally, the upper surface 220 of the fins may be extruded to form contours, depressions, grooves, ridges, projections, etc. By having a non-planar upper surface 220, turbulences may be created. The turbulences may cause more efficient air flow through the fins and heat sink.

Figure 3:
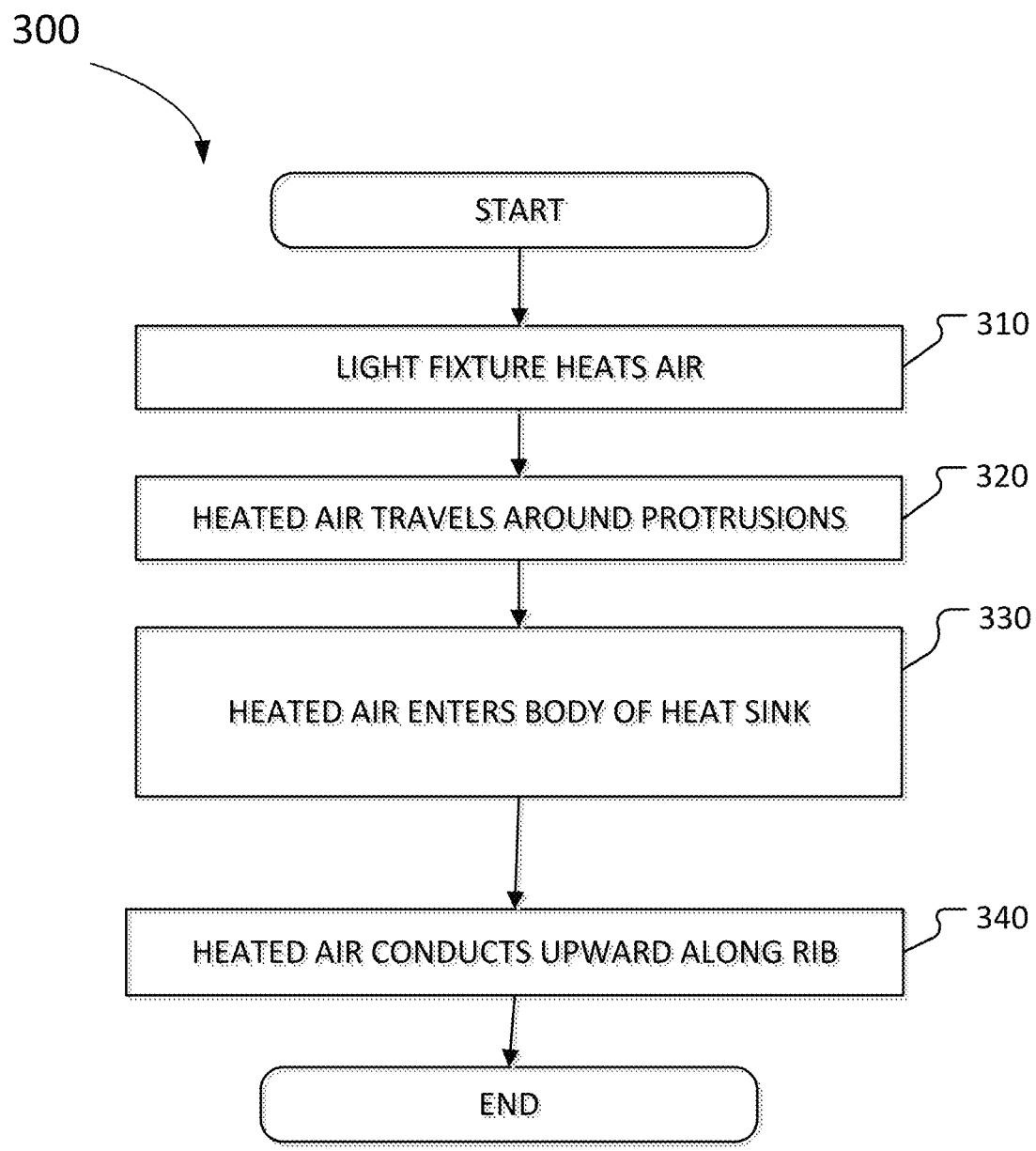
FIG. 3 illustrates a method for a heat sink with a rib, according to an embodiment.

FIG. 3 illustrates a method 300 for a heat sink with a rib, according to an embodiment. The operations of method 300 presented below are intended to be illustrative. In some embodiments, method 300 may be accomplished with one or more additional operations not described, and/or without one or more of the operations discussed. Additionally, the order in which the operations of method 300 are illustrated in FIG. 3 and described below is not intended to be limiting.

At operation 310, air below the heat sink may be heated by a light fixture positioned directly below the heat sink.

At operation 320, the heated air may travel around angled protrusions on the base of the heat sink, wherein the ends of the angled protrusions is positioned between the rib and the ends of the fins.

At operation 330, the heated air may enter the heat sink via partially exposed lower surfaces of the fins, wherein the lower surface of the fins are partially exposed from the first end of the protrusions to outer edges of the fins.

At operation 340, the heated air may conduct upward from a position proximate to the central axis of the heat sink above the light source on both sides of the rib. As hot air rises, cooler air may be drawn into the heatsink. This process may cool the fins.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A linear heat sink for a light fixture formed from a unitary block of metal, the linear heat sink comprising:
   a rib formed by not fully extruding the unitary block of metal, the rib extending along a central longitudinal axis of the heat sink from a first end of the linear heat sink to a second end of the linear heat sink;
   first fins positioned on a first side of the rib, the first fins formed by extruding the unitary block of metal on the first side of the rib, the extruding extending from an upper surface of the unitary block of metal to a lower surface of the unitary block of metal;
   second fins positioned on a second side of the rib, the second fins formed by extruding the unitary block of metal on the second side of the rib, being formed by extruding the unitary block of metal from the upper surface of the unitary block of metal to the lower surface of the unitary block of metal on the second side of the rib; and
   a single, continuous base, wherein the base:
      has a central longitudinal axis that is directly aligned with the central longitudinal axis of the heat sink and a transverse axis that is transverse to the central longitudinal axis of the base;
      has a length extending along the central longitudinal axis of the base;
      has a transverse width extending along the transverse axis of the base which defines a flat portion of the base, wherein the length is greater than the transverse width; and comprises protrusions positioned on two opposite, distal ends of the base relative to the transverse axis, the protrusions extend at a downward angle from the flat portion of the base that partially expose lower surfaces of the first fins and the second fins
      is configured to cover portions of a lower surface of the linear heat sink such that each of the first fins and the second fins extend an equal distance beyond the flat portion of the base along the transverse axis of the base but do not extend beyond the protrusions of the base along the transverse axis of the base.

2. The linear heat sink of claim 1, wherein the rib extends from the lower surface of the linear heat sink to an upper surface of the linear heat sink.

3. The linear heat sink of claim 1, wherein the first fins and the second fins include grooves.

4. The linear heat sink of claim 1, wherein the rib includes grooves.

5. The linear heat sink of claim 1, wherein the base is configured to be directly coupled to multiple sections of the heat sink, each of the multiple sections including the rib, the first fins, and the second fins, wherein the base is a metal core printed circuit board base.

6. The linear heat sink of claim 1, wherein the first fins and the second fins have three exposed edges, and a fourth edge being covered by the rib.

7. The linear heat sink of claim 1, wherein upper surfaces of the first fins and the second fins are planar with an upper surface of the rib.

* * * * *